United States Patent
Huang et al.

(10) Patent No.: US 9,064,856 B1
(45) Date of Patent: Jun. 23, 2015

(54) FLIP-CHIP LED COMPONENT BUILT THEREIN WITH A ZENER CHIP

(71) Applicant: FORMOSA MICROSEMI CO., Ltd., New Taipei (TW)

(72) Inventors: Wen-Ping Huang, New Taipei (TW); Tzuu-Chi Hu, New Taipei (TW)

(73) Assignee: FORMOSA MICROSEMI CO., LTD., New Taipei (TW)

( * ) Notice: Subject to any disclaimer, the term of this patent is extended or adjusted under 35 U.S.C. 154(b) by 0 days.

(21) Appl. No.: 14/273,798

(22) Filed: May 9, 2014

(30) Foreign Application Priority Data

Mar. 28, 2014 (TW) .............................. 103111640 A

(51) Int. Cl.
*H01L 23/495* (2006.01)
*H01L 33/52* (2010.01)
*H01L 33/62* (2010.01)

(52) U.S. Cl.
CPC .......... *H01L 23/49555* (2013.01); *H01L 33/62* (2013.01); *H01L 33/52* (2013.01); *H01L 23/49575* (2013.01)

(58) Field of Classification Search
CPC ................... H01L 23/49555; H01L 23/49575; H01L 33/52; H01L 33/62; H01L 27/14618
See application file for complete search history.

(56) References Cited

U.S. PATENT DOCUMENTS

2013/0292812 A1* 11/2013 Seo et al. ....................... 257/676

* cited by examiner

*Primary Examiner* — Phat X Cao

(57) ABSTRACT

In the Flip-Chip type LED component built therein with a Zener chip: a Flip-Chip LED chip and a Flip-Chip Zener straddle respectively over and beneath two electrode pins, wherein the Flip-Chip Zener is covered with insulating material to form a base and the Flip-Chip LED chip is covered with a transparent package to thereby form an integral Flip-Chip LED component, hence not only the Flip-Chip LED component can be protected in use, but also can largely simplify the production process and reduce the cost of production.

4 Claims, 2 Drawing Sheets

FLIP-CHIP LED COMPONENT BUILT THEREIN WITH A ZENER CHIP

BACKGROUND OF THE INVENTION

1. Field of the Invention

The present invention relates to an LED structure and a technique related to the LED production process, and especially to a Flip-Chip LED component made by a Flip-Chip technology and built therein with a voltage regulation chip (Zener chip) for protection.

2. Description of the Prior Art

A conventional production process of an LED component uses a metallic sheet being flush pressed firstly to form many sets of electrode stands (i.e. flush pressing shaping process of stands), each set of electrode stands is made firstly to form a bowel shaped base by an injection shaping mode (base shaping process), then these sets of electrode stands with the bowel shaped bases are sequentially treated one by one by using bonding process, wire bonding process and packing process to form an integral LED component.

By the fact that hi-power LED components will generate static electricity (ESD-Electrostatic storage deflection) in use to induce destruction, while Zener diodes in the components of semiconductors and diodes have the characteristic of voltage regulation, businessmen often make a parallel connection in their related LED circuit designing with a Zener diode to resist static electricity generation (ESD), or make a series connection with a Zener diode to help voltage regulation, so that the LED components can avoid being destructed by electric current.

To do along with the above usage of a Zener diode, some business men implant Zener chips in additional to the LED chips in the bonding stages of conventional LED components, and then further they proceed to wire bonding processes for LED chips and Zener chips; so that the LED components themselves are provided with protection against static electricity and of voltage regulation. Thereby, the lives of use of the LED components are prolonged, for example: patent cases U.S. Pat. No. 8,536,593 B2, CN 103000782 A etc. are such kind of techniques.

In addition to these, the Flip-Chip technology is also called as "Flip-chip packing" or "Flip-chip packing method", this is another advanced technique concerning the LED production process, it mainly puts a Flip-Chip LED chip on a plane where two connecting pins respectively deposited with a bump (respectively being a positive and a negative electric electrode) are, then the Flip-Chip is turned over to have the two bumps directly connected with the connecting pins of the positive and the negative electric electrodes to make direct electric connection (welding).

By virtue that the above Flip-Chip technology can make the chip connect directly with the connecting pins of the positive and the negative electric electrodes, this also has an advantage of fast heat conducting and scattering, thereby is very suitable to be used on high power LED components; and more, the electric connection can be done without wire bonding on the Flip-Chip LED chip, the working hour of the production can be largely reduced, this is much beneficial to reducing the volumes of the components; the technology has become a target that manufacturers concerned eagerly want to study, for example: US 2012/0241801 A1 and CN 203456494 U etc. are those prior arts being concerning with the Flip-Chip technology.

The above two prior arts: using of the regulation pressure technique and the Flip-Chip technology surely can add the practicability and efficiency of the LED components in their respective technical fields, but according to the experience of the inventor working in the related business designing and production, if the two different techniques can be integrated and used on an identical LED component, not only the LED component can have a function of resisting static electricity and a function of voltage regulation, but also has the advantage of the Flip-Chip technology in production.

SUMMARY OF THE INVENTION

An object of the present invention is to provide a Flip-Chip type LED component built therein with a Zener chip of which the whole structure is made by a Flip-Chip technology, by the fact that it is built therein with a voltage regulation chip (Zener chip), it not only can effectively protect the LED component in use, but also can largely reduce the cost of production.

For achieving the above object, the Flip-Chip type LED component built therein with a Zener chip of the present invention includes:

two electrode pins allocated at a right and a left side relatively, the two mutually confronting inner ends of the two electrode pins are spaced from each other, while two outer ends of the two electrode pins can be respectively connected with outside circuits;

a Flip-Chip LED chip of which a positive and a negative electrode respectively at its two lateral sides are respectively electrically connected with the two mutually confronting inner ends of the two electrode pins, in order that the Flip-Chip LED chip can straddle over the two mutually confronting inner ends of these two electrode pins;

a Flip-Chip Zener of which two P/N electrodes at its two lateral sides are electrically connecting respectively with the above mentioned inner ends of the above two electrode pins, in order that the Flip-Chip Zener can straddle beneath the inner ends of these two electrode pins;

a base being made of insulating material and covering the Flip-Chip Zener and the two electrode pins, the above two outer ends of the two electrode pins respectively are exposed out of the base; and a transparent package covering the Flip-Chip LED chip and the two electrode pins, when the two outer ends of the two electrode pins are connected with a power supply, the Flip-Chip LED chip can be lightened to make the light beams project out of the transparent package, and can at the same time have a protection capability for the Flip-Chip LED chip by the function of static electricity resisting and voltage regulation of the Flip-Chip Zener.

Because the whole structure of the Flip-Chip LED component is made by Flip-Chip technology and is built therein with a Zener chip, not only the Flip-Chip LED component can be protected in use, but also the process of wire bonding can be omitted, the production process can be largely simplified and the cost of production can be reduced; particularly, the Flip-Chip LED component made by Flip-Chip technology further can reduce the thickness of the Flip-Chip LED component as compared with the conventional production process, so that the LED component used can be coincident with the tendency of having electronic products become lighter and thinner in designing.

The followings further describe the modes of practice of the components:

In practice, soldering pads are provided respectively between the two P/N electrodes respectively at two lateral sides of the Flip-Chip LED chip and the two mutually confronting inner ends of the two electrode pins, and between the two P/N electrodes respectively at the two lateral sides of the Flip-Chip Zener and the above mentioned inner ends of the two electrode pins for the purpose of soldering at these spots and for electric connection.

In practice, the two mutually confronting inner ends of these two electrode pins are allocated on an identical plane, while the two outer ends respectively of the two electrode pins are bended downwards and then are bended laterally to form two outer ends, and the bottom surfaces of the two outer ends are exposed at the bottom of the base.

And in practice, insulating material of the above mentioned base is filled between the two inner ends of the two electrode pins, and a bowel shaped stage extends upwards from the locations surrounding the two mutually confronting inner ends of the two electrode pins; the Flip-Chip LED chip is located at the inner surface of the bowel shaped stage, while the above mentioned transparent package is provided on the inner surface of the bowel shaped stage to envelope the Flip-Chip LED chip and the two mutually confronting inner ends of the two electrode pins.

In comparison with the prior art, the present invention is provided on the top surfaces and the bottom surfaces of the two inner ends of the two electrode pins respectively with the Flip-Chip LED chip and the Flip-Chip Zener, so that the whole LED component can be made by using the technique with Flip-Chip, hence not only there is no necessity of the wire bonding process in production to largely simplify the production process, but also the LED components can be effectively protected in using, and this can allow reducing the thicknesses of the LED components to render the LED components to meet the tendency of design that makes electronic products light and thin.

The present invention will be apparent after reading the detailed description of the preferred embodiments thereof in reference to the accompanying drawings.

DETAILED DESCRIPTION OF THE PREFERRED EMBODIMENT

Figure 1:
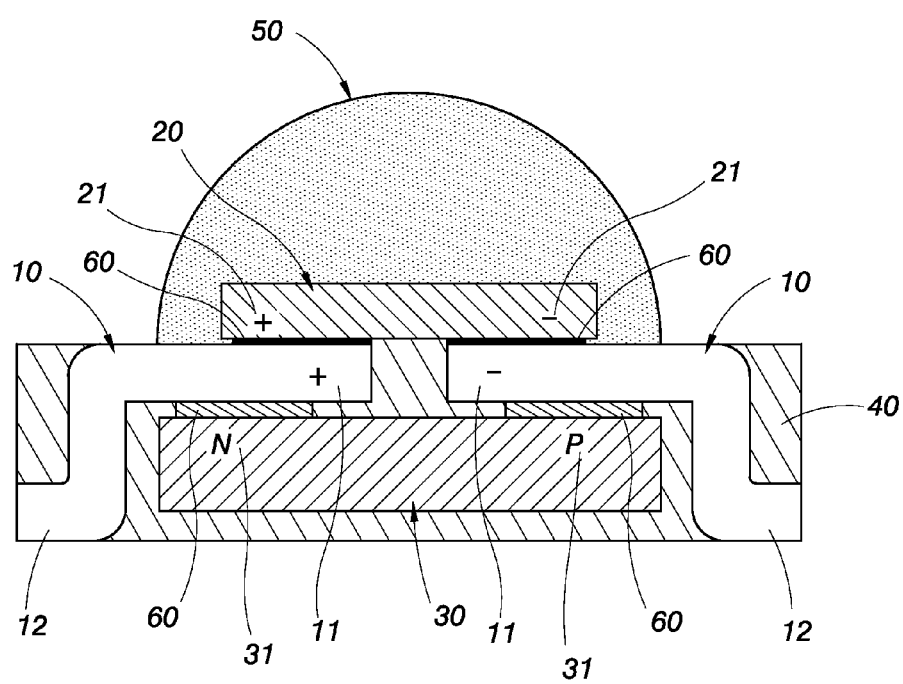
FIG. 1 is a schematic sectional view showing the structure of the first embodiment of the present invention.

Referring to FIG. 1, the Flip-Chip LED component built therein with a voltage regulation chip (Zener chip) of the present invention comprise two electrode pins 10, a Flip-Chip LED chip 20, a Flip-Chip Zener 30, a base 40 made of insulating material and a transparent package 50: In which:

the two electrode pins 10 are allocated at a right and a left side relatively, two mutually confronting inner ends 11 of the two electrode pins 10 are spaced from each other, while two outer ends 12 of the pins 10 can be respectively connected with outside circuits; as shown in the drawings, the two mutually confronting inner ends 11 of these two electrode pins 10 are allocated on an identical plane, while the two outer ends respectively of the two electrode pins 10 are bended downwards and then are bended laterally to form two outer ends 12;

the above mentioned Flip-Chip LED chip 20 has a positive and a negative electrode 21 respectively at its two lateral sides, these positive and negative electrodes 21 are respectively electrically connected with the two mutually confronting inner ends 11 of the above two electrode pins 10, in order that the Flip-Chip LED chip 20 can straddle over the two mutually confronting inner ends 11 of these two electrode pins 10;

the Flip-Chip Zener 30 of which the two lateral sides have the two P/N electrodes 31 respectively for electrically connecting respectively with the above mentioned inner ends 11 of the above two electrode pins 10, in order that the Flip-Chip Zener 30 can straddle beneath the inner ends 11 of these two electrode pins 10.

In the drawings, soldering pads 60 are provided respectively between the P/N electrodes 21 respectively at the two lateral sides of the Flip-Chip LED chip 20 and the two mutually confronting inner ends 11 of the above two electrode pins 10, and respectively between the two P/N electrodes 31 at the two lateral sides of the Flip-Chip Zener 30 and the inner ends 11 of the two electrode pins 10 for the purpose of soldering at these spots and for electric connection; so that the Flip-Chip LED chip 20 and the Flip-Chip Zener 30 can directly electrically connected respectively with the two electrode pins 10 by taking the advantage of a Flip-Chip technology.

The above mentioned base 40 is made of insulating material, it is shaped by injection molding in a plastic mold and envelopes the Flip-Chip Zener 30 and the two electrode pins 10, so that the bottom surfaces of the two outer ends 12 of the two electrode pins 10 are respectively exposed out of the base 40, in order that the two outer ends 12 of the two electrode pins 10 can be electrically connected with an outside circuit (not shown); and more, when the base 40 is shaped, the insulating material is filled between the two inner ends 11 of the two electrode pins 10, in order that the two inner ends 11 are surely in a mutually insulated state.

The above mentioned transparent package 50 is made of material normally used for LED packing, for instance, made of epoxy or silicone etc., the transparent package 50 covers the Flip-Chip LED chip 20 and the two electrode pins 10, when the two outer ends 12 of the two electrode pins 10 are connected with a power supply, the Flip-Chip LED chip 20 can be lightened to make the light beams project out of the transparent package 50, and can at the same time have a protection capability for the Flip-Chip LED chip 20 by the function of static electricity resisting and voltage regulation of the Flip-Chip Zener 30.

By virtue that the whole structure of the above mentioned Flip-Chip LED component is made by the Flip-Chip technology and is built therein with a Zener chip, not only the Flip-Chip LED component can be protected in use, but also can save the process of wire bonding, largely simplify the production process and reduce the cost of production; particularly, the Flip-Chip LED component made by Flip-Chip technology further can reduce the thickness of the Flip-Chip LED component as compared with the conventional production process, so that the LED component used can be coincident with the tendency of having electronic products become lighter and thinner in designing.

Figure 2:
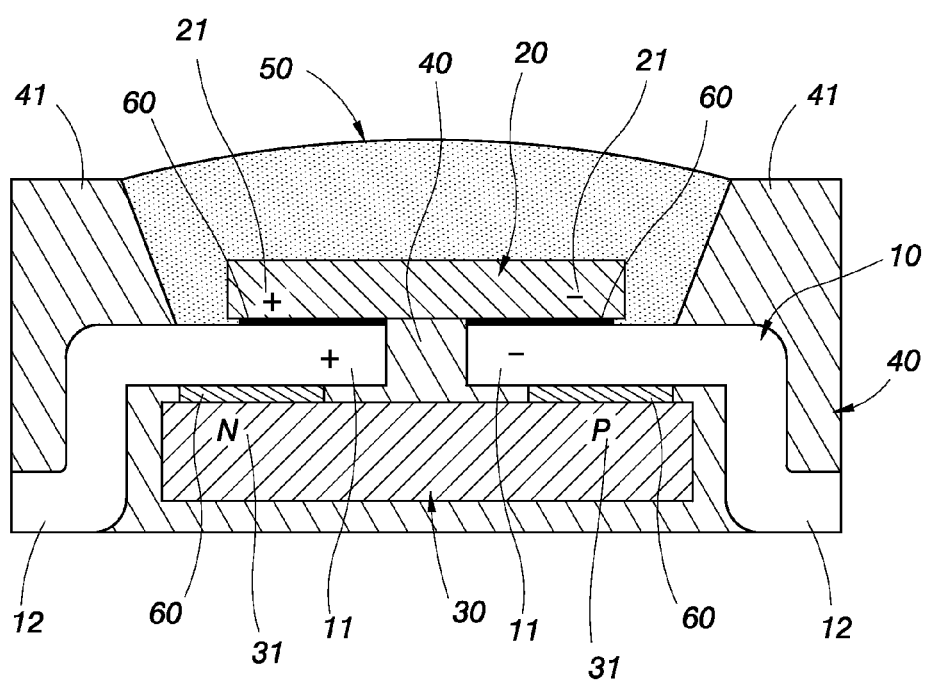
FIG. 2 is a schematic sectional view showing the structure of the second embodiment of the present invention.

Referring to FIG. 2 which shows the structure of the second embodiment of the present invention, the structure is different from the first embodiment in that: a bowel shaped stage 41 (with an inner surface forming a shape of a bowel) extends upwards from the locations surrounding the two mutually confronting inner ends 11 of the two electrode pins 10; the Flip-Chip LED chip 20 is located at the inner surface of the bowel shaped stage 41, while the above mentioned transparent package 50 is provided on the inner surface of the bowel shaped stage 41 to envelope the Flip-Chip LED chip 20 and the two mutually confronting inner ends of the two electrode pins 10. The base 40 of this embodiment is partially like a bowel shaped base provided for a package in the prior art, namely, the appearance of it is similar to that of the prior art, but there is a difference: the base 40 of the present invention further covers the Flip-Chip Zener 30, and more, the Flip- Chip LED chip 20 in the bowel shaped stage 41 and the two electrode pins 10 do not need a wire bonding process.

As compared with the prior art, in the present invention, the top surfaces and the bottom surfaces of the two inner ends 11 of the two electrode pins 10 are provided respectively with the Flip-Chip LED chip 20 and the Flip-Chip Zener 30, the whole LED component can thus be made by using the technique with Flip-Chip, hence not only there is no necessity of the wire bonding process in production to largely simplify the production process and reduce cost, but also the LED components can be effectively protected in using, and this can allow reducing the thicknesses of the LED components to render the components to meet the tendency of design that makes electronic products light and thin.

The specification described and the shape shown in the drawings of the present invention are only for illustrating a preferred embodiment of the present invention, and not for giving any limitation to the scope of the present invention. It will be apparent to those skilled in this art that various modifications or changes, without departing from the spirit, scope and characteristic of this invention shall fall within the scope of the appended claims.

The invention claimed is:

1. A Flip-Chip type LED component built therein with a Zener chip, said component comprises:
    two electrode pins allocated at a right and a left side relatively, two mutually confronting inner ends of said two electrode pins are spaced from each other, while two outer ends of said electrode pins are respectively connected with outside circuits;
    a Flip-Chip LED chip of which a positive and a negative electrode respectively at its two lateral sides are respectively electrically connected with said two mutually confronting inner ends of said two electrode pins, in order that said Flip-Chip LED chip straddles over said two mutually confronting inner ends of said two electrode pins;
    a Flip-Chip Zener of which two P/N electrodes at its two lateral sides are electrically connecting respectively with said inner ends of said two electrode pins, in order that said Flip-Chip Zener straddles beneath said inner ends of said two electrode pins;
    a base being made of insulating material and covering said Flip-Chip Zener and said two electrode pins, said two outer ends of said two electrode pins respectively are exposed out of said base; and
    a transparent package covering said Flip-Chip LED chip and said two electrode pins, when said two outer ends of said two electrode pins are connected with a power supply, said Flip-Chip LED chip is lightened to make light beams project out of said transparent package, and at same time gets a protection capability for said Flip-Chip LED chip by functions of static electricity resisting and voltage regulation of said Flip-Chip Zener.

2. The Flip-Chip type LED component built therein with a Zener chip as claimed in claim 1, wherein soldering pads are provided respectively between said two P/N electrodes respectively at two lateral sides of said Flip-Chip LED chip and said two mutually confronting inner ends of said two electrode pins, and between said two P/N electrodes respectively at two lateral sides of said Flip-Chip Zener and said inner ends of said two electrode pins for soldering and for electric connection.

3. The Flip-Chip type LED component built therein with a Zener chip as claimed in claim 1, wherein said two mutually confronting inner ends of said two electrode pins are allocated on an identical plane, while said two outer ends respectively of said two electrode pins are bended downwards and then are bended laterally to form two outer ends, and bottom surfaces of said two outer ends are exposed at a bottom of said base.

4. The Flip-Chip type LED component built therein with a Zener chip as claimed in claim 1, wherein insulating material of said base is filled between said two inner ends of said two electrode pins, and a bowel shaped stage extends upwards from locations surrounding said two mutually confronting inner ends of said two electrode pins; said Flip-Chip LED chip is located at an inner surface of said bowel shaped stage, while said transparent package is provided on said inner surface of said bowel shaped stage to envelope said Flip-Chip LED chip and said two mutually confronting inner ends of said two electrode pins.

\* \* \* \* \*